US011490550B2

(12) United States Patent
Jung et al.

(10) Patent No.: US 11,490,550 B2
(45) Date of Patent: Nov. 1, 2022

(54) ELECTRONIC DEVICE INCLUDING HEAT RADIATING STRUCTURE

(71) Applicant: Samsung Electronics Co., Ltd., Gyeonggi-do (KR)

(72) Inventors: Chunghyo Jung, Gyeonggi-do (KR); Jaedeok Lim, Gyeonggi-do (KR); Hyein Park, Gyeonggi-do (KR); Jaehyoung You, Gyeonggi-do (KR)

(73) Assignee: Samsung Electronics Co., Ltd

( * ) Notice: Subject to any disclaimer, the term of this patent is extended or adjusted under 35 U.S.C. 154(b) by 112 days.

(21) Appl. No.: 17/060,785

(22) Filed: Oct. 1, 2020

(65) Prior Publication Data

US 2021/0161039 A1 May 27, 2021

(30) Foreign Application Priority Data

Nov. 25, 2019 (KR) ........................ 10-2019-0152392

(51) Int. Cl.
*H05K 7/14* (2006.01)
*H05K 7/18* (2006.01)
*H05K 9/00* (2006.01)
*H05K 7/20* (2006.01)
*H05K 1/02* (2006.01)
*H05K 5/00* (2006.01)

(52) U.S. Cl.
CPC ......... *H05K 9/0081* (2013.01); *H05K 1/0203* (2013.01); *H05K 5/0026* (2013.01); *H05K 7/2039* (2013.01); *H05K 9/0024* (2013.01)

(58) Field of Classification Search
USPC ................................ 361/800, 807, 809, 810
See application file for complete search history.

(56) References Cited

U.S. PATENT DOCUMENTS 9,224,672 B1* 12/2015 Pykäri .................. H01L 23/373
11,013,150 B2* 5/2021 Kim ...................... H05K 7/1427
2014/0055957 A1* 2/2014 Yang .................... H05K 1/0204
428/335

(Continued)

FOREIGN PATENT DOCUMENTS

CN 108702858 10/2018
EP 3 419 398 12/2018
(Continued)

OTHER PUBLICATIONS

International Search Report dated Jan. 12, 2021 issued in counterpart application No. PCT/KR2020/013476, 7 pages.

Primary Examiner — Hung S. Bui
(74) Attorney, Agent, or Firm — The Farrell Law Firm, P.C.

(57) ABSTRACT

An electronic device is provided. The electronic device includes a circuit board, at least one electric component disposed on one surface of the circuit board, a shield can mounted on the one surface of the circuit board, with the at least one electric component received in the shield can, and including at least one opening formed in an area corresponding to the at least one electric component, a shielding sheet disposed in at least a portion of the shield can and blocking at least a portion of the at least one opening, and a heat transfer member disposed in contact between the at least one electric component and the shielding sheet. The shielding sheet includes a flexible structure.

13 Claims, 15 Drawing Sheets

(56) References Cited

U.S. PATENT DOCUMENTS

| | | |
|---|---|---|
| 2015/0077945 A1 | 3/2015 | Rhee |
| 2015/0220122 A1 | 8/2015 | Rhee et al. |
| 2015/0264842 A1* | 9/2015 | Song .................. H01L 23/42 29/840 |
| 2015/0323262 A1 | 11/2015 | Kim |
| 2016/0279900 A1 | 9/2016 | Fujiwara et al. |
| 2017/0054836 A1* | 2/2017 | Chung ............... H04M 1/0277 |
| 2017/0181264 A1* | 6/2017 | Brey .................. H05K 1/0203 |
| 2017/0251549 A1 | 8/2017 | Lee et al. |
| 2018/0288908 A1* | 10/2018 | Lee .................. H05K 7/20336 |
| 2019/0320562 A1 | 10/2019 | Seo et al. |
| 2020/0053919 A1 | 2/2020 | Lee et al. |
| 2020/0352057 A1 | 11/2020 | Jung et al. |
| 2020/0389999 A1 | 12/2020 | Lee et al. |

FOREIGN PATENT DOCUMENTS

| | | |
|---|---|---|
| JP | 2019-024074 | 2/2019 |
| KR | 1020150091873 | 8/2015 |
| KR | 1020150127473 | 11/2015 |
| KR | 1020160045336 | 4/2016 |
| KR | 1020160086338 | 7/2016 |
| KR | 1020160142720 | 12/2016 |
| KR | 1020170097541 | 8/2017 |
| KR | 1020180109615 | 10/2018 |
| KR | 1020190053589 | 5/2019 |
| KR | 1020190101640 | 9/2019 |

\* cited by examiner

ND HEAT
ELECTRONIC DEVICE INCLUDING HEAT RADIATING STRUCTURE

CROSS-REFERENCE TO RELATED APPLICATION(S)

This application is based on and claims priority under 35 U.S.C. 119 to Korean Patent Application No. 10-2019-0152392, filed on Nov. 25, 2019, in the Korean Intellectual Property Office, the disclosure of which is incorporated herein by reference in its entirety.

BACKGROUND

1. Field

The present disclosure relates generally to heat radiating structures that shield off electromagnetic waves from electric components in an electronic device or electronic devices including the same.

2. Description of Related Art

Advancing information communication and semiconductor technologies accelerate the spread and use of various electronic devices. In particular, recent electronic devices are being developed to carry out communication while being carried around.

The term "electronic device" may refer to a device performing a particular function according to its equipped program, such as a home appliance, an electronic scheduler, a portable multimedia player, a mobile communication terminal, a tablet PC, a video/sound device, a desktop PC or laptop computer, navigation for automobile, etc. Electronic devices may output stored information as voices or images. As electronic devices are highly integrated, and high-speed, high-volume wireless communication becomes commonplace, an electronic device, such as a mobile communication terminal, is recently being equipped with various functions. An electronic device comes with the integrated functionality, including an entertainment function, such as playing video games, a multimedia function, such as replaying music/videos, a communication and security function for mobile banking, and a scheduling or e-wallet function. Such electronic devices become compact enough for users to carry in a convenient way.

Typically, an electronic device has a printed circuit board (PCB) and various electronic components in component mounting brackets. Some electric components mounted on the PCB generate electromagnetic waves and/or heat which may cause a malfunction and performance deterioration of the electronic device.

To radiate the heat generated inside the electronic device, various heat radiating members are available. Direct attaching of a heat radiating member to some electric components (e.g., an application processor (AP)) may result in difficulty due to limited EMI shielding, insulation, thickness, or strength. To raise the thermal density of some electric components (e.g., an AP) requires use of a high heat-capacity, low heat-resistance material, but a design difficulty ensues.

Conventional heat radiating structures need to use a support layer (e.g., a copper (Cu) plate) for mass production, which results in difficulty in thermocompression attaching and designing a heat transfer member to be attached to the support layer, and a reduction in shielding performance.

SUMMARY

The present disclosure has been made to address at least the disadvantages described above and to provide at least the advantages described below.

In accordance with an aspect of the present disclosure, an electronic device is provided. The electronic device includes a circuit board, at least one electric component disposed on one surface of the circuit board, a shield can mounted on the one surface of the circuit board, with the at least one electric component received in the shield can, and including at least one opening formed in an area corresponding to the at least one electric component, a shielding sheet disposed in at least a portion of the shield can and blocking at least a portion of the at least one opening, and a heat transfer member disposed in contact between the at least one electric component and the shielding sheet. The shielding sheet includes a flexible structure, and the shielding sheet includes a first area disposed in at least a portion of the shield can, a second area disposed on a top surface of the heat transfer member, and a third area extending from the first area to the second area and forming a designated inclined surface or curved surface.

In accordance with an aspect of the present disclosure, an electronic device is provided. The electronic device includes a housing, a circuit board disposed in the housing, at least one electric component disposed on one surface of the circuit board, a shield can formed to surround at least a portion of the at least one electric component and including an opening in a portion facing the at least one electric component, a heat transfer member disposed in contact between the at least one electric component and the shielding sheet. The shielding sheet and the heat transfer member have an integral structure, and at least a portion of the shielding sheet forms a designated inclined surface or curved surface.

In accordance with an aspect of the present disclosure, a method of manufacturing an electronic device is provided. The method includes pre-forming a shielding sheet including an inclined surface or a curved surface using a silicone compressing jig, aligning the pre-formed shielding sheet with a carrier film and attaching a heat radiating member to one surface of the pre-formed shielding sheet, integrating a heat transfer member to one surface of the pre-formed shielding sheet, attaching the integrated shielding sheet-heat transfer member structure to a shield can using the carrier film, removing the carrier film, and attaching a cooling sheet to one area of the carrier film-removed shielding sheet.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION

Figure 1:
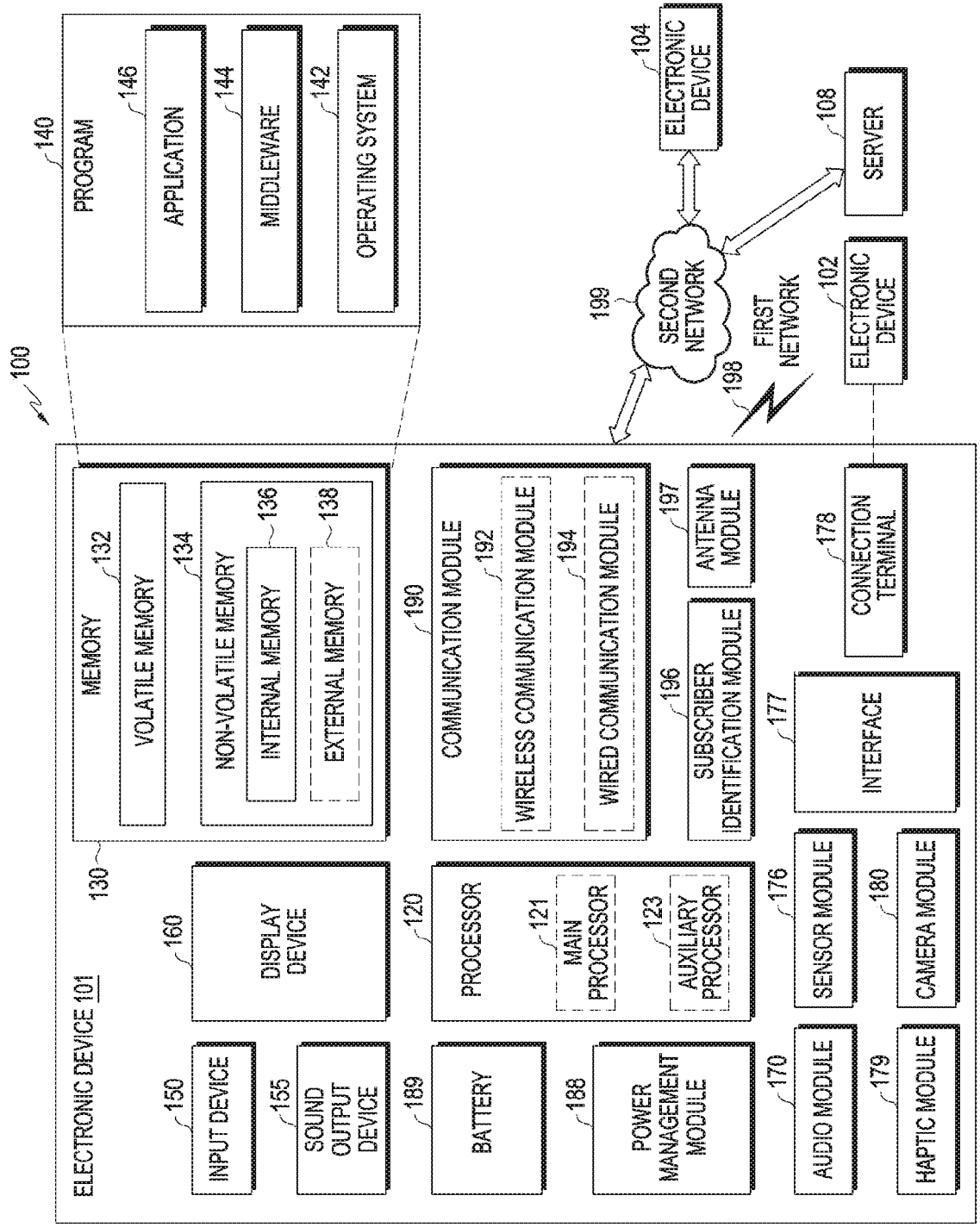
FIG. 1 is a view illustrating an electronic device in a network environment, according to an embodiment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SLUT) 196, or an antenna module 197. In some embodiments, at least one e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an AP), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational (e.g., power or temperature of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device). According to an embodiment, the antenna module may include one antenna including a radiator formed of a conductor or conductive pattern formed on a substrate (e.g., a PCB). According to an embodiment, the antenna module 197 may include a plurality of antennas. In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, instructions or data may be transmitted or received between the electronic device 101 and the external electronic device 104 via the server 108 coupled with the second network 199. The external electronic devices 102 and 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals ray be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
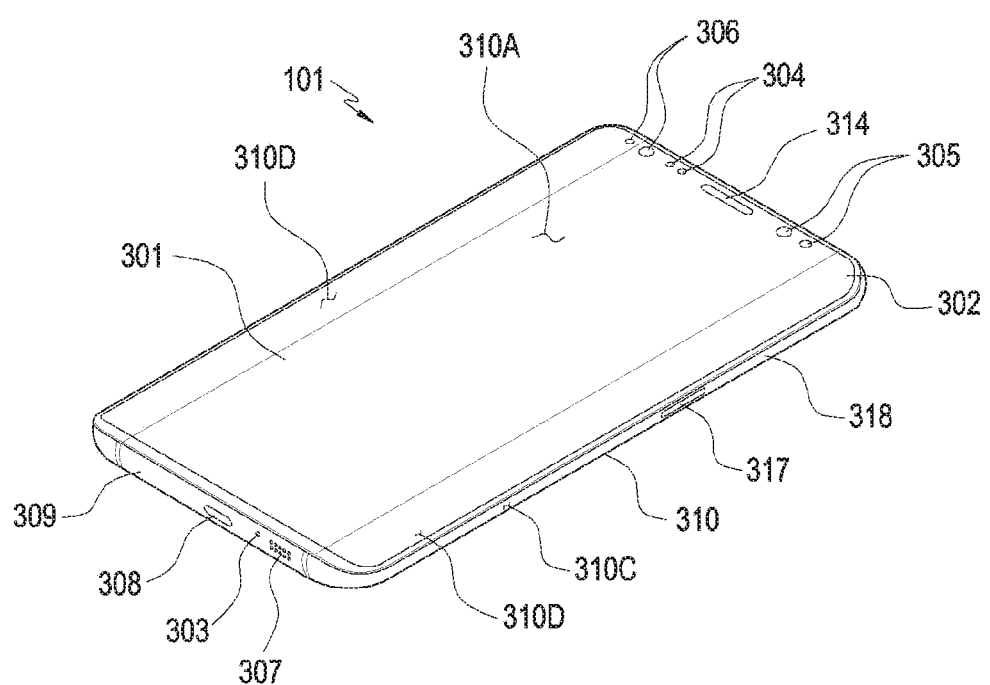
FIG. 2 is a front perspective view illustrating an electronic device, according to an embodiment.
Figure 3:
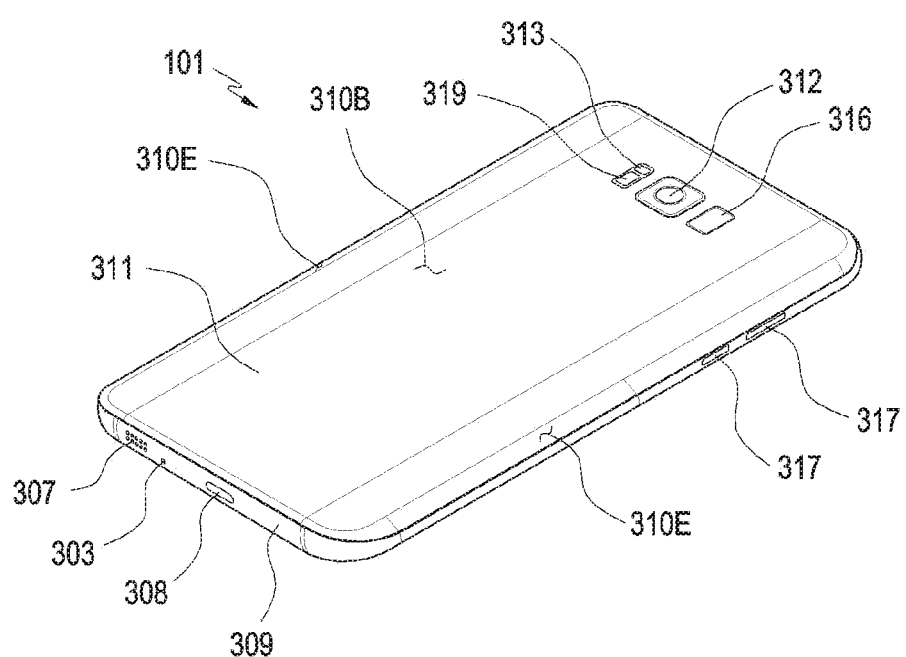
FIG. 3 is a rear perspective view illustrating an electronic device, according to an embodiment.

FIG. 2 is a front perspective view illustrating an electronic device 101, according to an embodiment FIG. 3 is a rear perspective view illustrating an electronic device 101, according to an embodiment.

Referring to FIGS. 2 and 3, an electronic device 101 may include a housing 310 with a first (or front) surface 310A, a second (or rear) surface 310B, and a side surface 310C surrounding a space between the first surface 310A and the second surface 310B. The housing may denote a structure forming part of the first surface 310A, the second surface 310B, and the side surface 310C of FIG. 2. At least part of the first surface 310A may have a substantially transparent front plate 302 (e.g., a glass plate or polymer plate). The second surface 310B may be formed of a substantially opaque rear plate 311. The rear plate 311 may be formed of laminated or colored glass, ceramic, polymer, metal (e.g., aluminum, stainless steel (STS), or magnesium), or a combination of at least two thereof. The side surface 310C may be formed by a side bezel structure (or a side member) 318 that couples to the front plate 302 and the rear plate 311 and includes a metal and/or polymer. The rear plate 311 and the side bezel plate 318 may be integrally formed together and include the same material (e.g., a metal, such as aluminum).

The front plate 302 may include two first regions 310D, which seamlessly and bendingly extend from the first surface 310A to the rear plate 311, on both the long edges of the front plate 302. The rear plate 311 may include second regions 310E, which seamlessly and bendingly extend from the second surface 310B to the front plate, on both the long edges. The front plate 302 (or the rear plate 311) may include only one of the first regions 310 (or the second regions 310E). Alternatively, the first regions 310D or the second regions 301E may partially be excluded. At side view of the electronic device 101, the side bezel structure 318 may have a first thickness (or width) for sides that do not have the first regions 310D or the second regions 310E and a second thickness, which is smaller than the first thickness, for sides that have the first regions 310D or the second regions 310E.

The electronic device 101 may include at least one or more of a display 301, audio modules 303, 307, and 314, sensor modules 304, 316, and 319, camera modules 305, 312, and 313, key input devices 317, a light emitting device 306, and connector holes 308 and 309. The electronic device 101 may exclude at least one (e.g., the key input device 317 or the light emitting device 306) of the components or may add other components.

The display 301 may be visually exposed through a majority portion of the front plate 302. At least a portion of the display 301 may be exposed through the front plate 302 forming the first surface 310A and the first regions 310D of the side surface 310C. The edge of the display 301 may be formed to be substantially the same in shape as an adjacent outer edge of the front plate 302. The interval between the outer edge of the display 301 and the outer edge of the front plate 302 may remain substantially even to give a larger area of exposure the display 301.

The screen display region of the display 301 may have a recess or opening in a portion thereof, and at least one or more of the audio module 314, sensor module 304, camera module 305, and light emitting device 306 may be aligned with the recess or opening. At least one or more of the audio module 314, sensor module 304, camera module 305, fingerprint sensor 316, and light emitting device 306 may be included on the rear surface of the screen display region of the display 301. The display 301 may be disposed to be coupled with, or adjacent, a touch detecting circuit, a pressure sensor capable of measuring the strength (pressure) of touches, and/or a digitizer for detecting a magnetic field-type stylus pen. At least part of the sensor modules 304 and/or at least part of the key input device 317 may be disposed in the first regions 310D and/or the second regions 310E.

The audio modules 303, 307, and 314 may include a microphone hole 303 and speaker holes 307 and 314. The microphone hole 303 may have a microphone inside to obtain external sounds. There may be a plurality of microphones to be able to detect the direction of a sound. The speaker holes 307 and 314 may include an external speaker hole 307 and a phone receiver hole 314. The speaker holes 307 and 314 and the microphone hole 303 may be implemented as a single hole, or speakers may be rested without the speaker holes 307 and 314 (e.g., piezo speakers). The audio modules 303, 307, and 314 are not limited to the above-described structure. Depending on the structure of the electronic device 101, various design changes may be made, such as only some of the audio modules may be mounted, or a new audio module may be added.

The sensor modules 304, 316, and 319 may generate an electrical signal or data value corresponding to an internal operating state or external environmental state of the electronic device 101. The sensor modules 304, 316, and 319 may include a first sensor module 304 (e.g., a proximity sensor) and/or a second sensor module (e.g., a fingerprint sensor) disposed on the first surface 310A of the housing 310 and/or a third sensor module 319 (e.g., a heart-rate monitor (HRM) sensor) and/or a fourth sensor module 316 (e.g., a fingerprint sensor) disposed on the second surface 310B of the housing 310. The fingerprint sensor may be disposed on the second surface 310B as well as on the first surface 310A (e.g., the display 301) of the housing 310. The electronic device 101 may further include sensor modules, such as at least one of a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, or an illuminance sensor. The sensor modules 304, 316, and 319 are not limited to the above-described structure. Depending on the structure of the electronic device 101, various design changes may be made, such as only some of the sensor modules may be mounted, or a new sensor module may be added.

The camera modules 305, 312, and 313 may include a first camera device 305 disposed on the first surface 310A of the electronic device 101, and a second camera device 312 and/or a flash 313 disposed on the second surface 310B. The camera modules 305 and 312 may include one or more lenses, an image sensor, and/or an ISP. The flash 313 may include a light emitting diode (LED) or a xenon lamp. Two or more lenses (an IR camera, a wide-angle lens, and a telescopic lens) and image sensors may be disposed on one surface of the electronic device 101. The camera modules 305, 312, and 313 are not limited to the above-described structure. Depending on the structure of the electronic device 101, various design changes may be made, such as only some of the camera modules may be mounted, or a new camera module may be added.

The key input device 317 may be disposed on the side surface 310C of the housing 310. The electronic device 101 may exclude all or some of the above-mentioned key input devices 317 and the excluded key input devices 317 may be implemented in other forms, such as soft keys, on the display 301. The key input device may include the sensor module 316 disposed on the second surface 310B of the housing 310.

The light emitting device 306 may be disposed on the first surface 310A of the housing 310. The light emitting device 306 may provide information about the state of the electronic device 101 in the form of light. The light emitting device 306 may provide a light source that interacts with the camera module 305. The light emitting device 306 may include an LED, an IR LED, or a xenon lamp.

The connector holes 308 and 309 may include a first connector hole 308 for receiving a connector (e.g., a USB connector) for transmitting or receiving power and/or data to/from an external electronic device and/or a second connector hole (e.g., an earphone jack) 309 for receiving a connector for transmitting or receiving audio signals to/from the external electronic device. The connector holes 308 and 309 are not limited to the above-described structure. Depending on the structure of the electronic device 101, various design changes may be made, such as only some of the connector holes may be mounted, or a new connector hole may be added.

Figure 4:
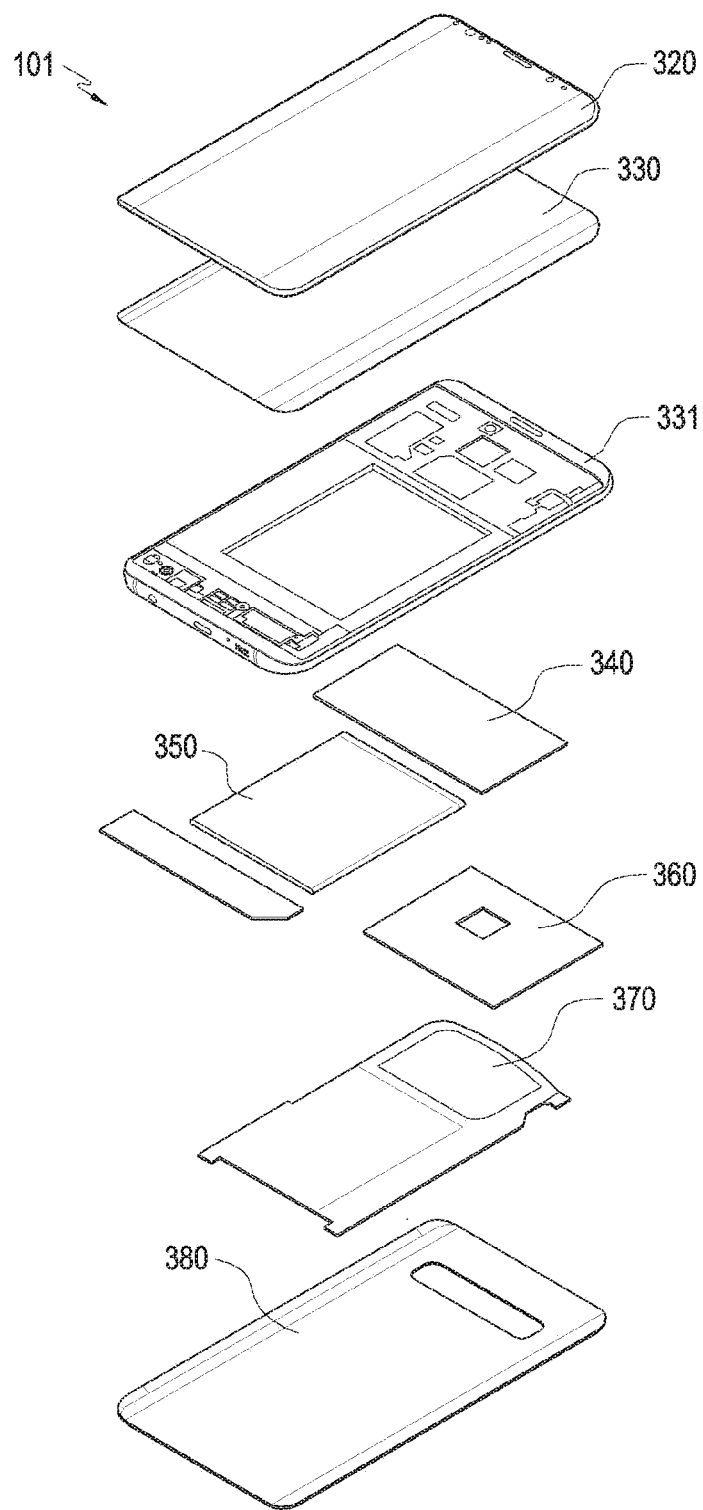
FIG. 4 is an exploded perspective view illustrating an electronic device, according to an embodiment.

FIG. 4 is an exploded perspective view illustrating an electronic device 101, according to an embodiment.

Referring to FIG. 4, an electronic device 101 may include a first supporting member 331 (e.g., a bracket), a front plate 320, a display 330, a PCB 340, a battery 350, a second supporting member 360 (e.g., a rear case), an antenna 370, and a rear plate 380. The electronic device 101 may exclude at least one (e.g., the first supporting member 331 or the second supporting member 360) of the components or may add other components. At least one of the components of the electronic device 101 may be the same or similar to at least one of the components of the electronic device 101 of FIG. 2 or 3 and no duplicate description is made below.

The first supporting member 331 may be disposed inside the electronic device 101 or may extend to the side bezel area. The first supporting member 331 may be formed of a metal and/or non-metallic material (e.g., polymer). The display 330 may be joined onto one surface of the first supporting member 331, and the PCB 340 may be joined onto the opposite surface of the first supporting member 311. A processor, a memory, and/or an interface may be mounted on the PCB 340. The processor may include one or more of a CPU, an AP, a GPU, an ISP, a sensor hub processor, or a CP.

The memory may include a volatile or non-volatile memory.

The interface may include, for example, an a USB interface, an SD card interface, and/or an audio interface. The interface may electrically or physically connect the electronic device 101 with an external electronic device and may include a USB connector, an SD card/multimedia card (MMC) connector, or an audio connector.

The battery 350 may be a device for supplying power to at least one component of the electronic device 101. The battery 189 may include a primary cell which is not rechargeable, a secondary cell which is rechargeable, or a fuel cell. At least a portion of the battery 350 may be disposed on substantially the same plane as the PCB 340. The battery 350 may be integrally or detachably disposed inside the electronic device 101.

The antenna 370 may be disposed between the rear plate 380 and the battery 350. The antenna 370 may include a near-field communication (NFC) antenna, a wireless charging antenna, and/or a magnetic secure transmission (MST) antenna. The antenna 370 may perform short-range communication with an external device or may wirelessly transmit or receive power necessary for charging. An antenna structure may be formed by a portion or combination of the first supporting member 331.

Figure 5:
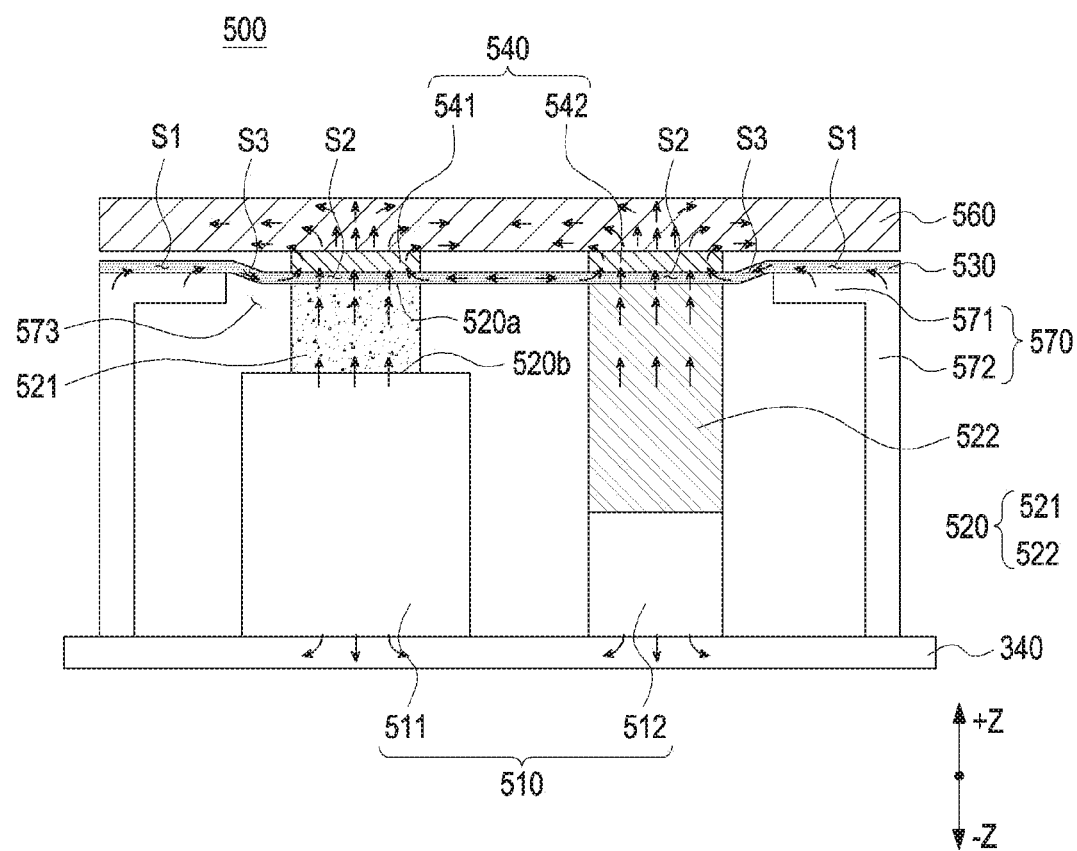
FIG. 5 is a cross-sectional view illustrating a structure for shielding and heat-radiation around an electric component, according to an embodiment.
Figure 6:
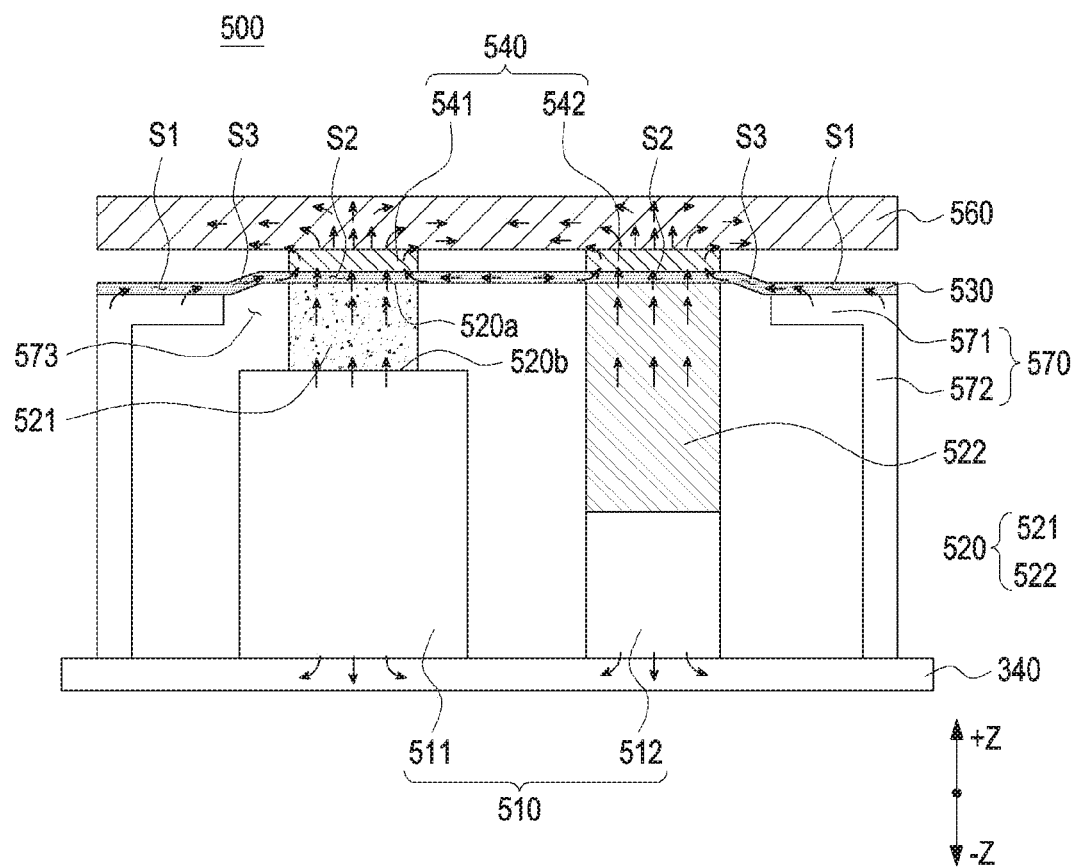
FIG. 6 is a cross-sectional view illustrating a structure for shielding and heat-radiation around an electric component, according to an embodiment.
Figure 7:
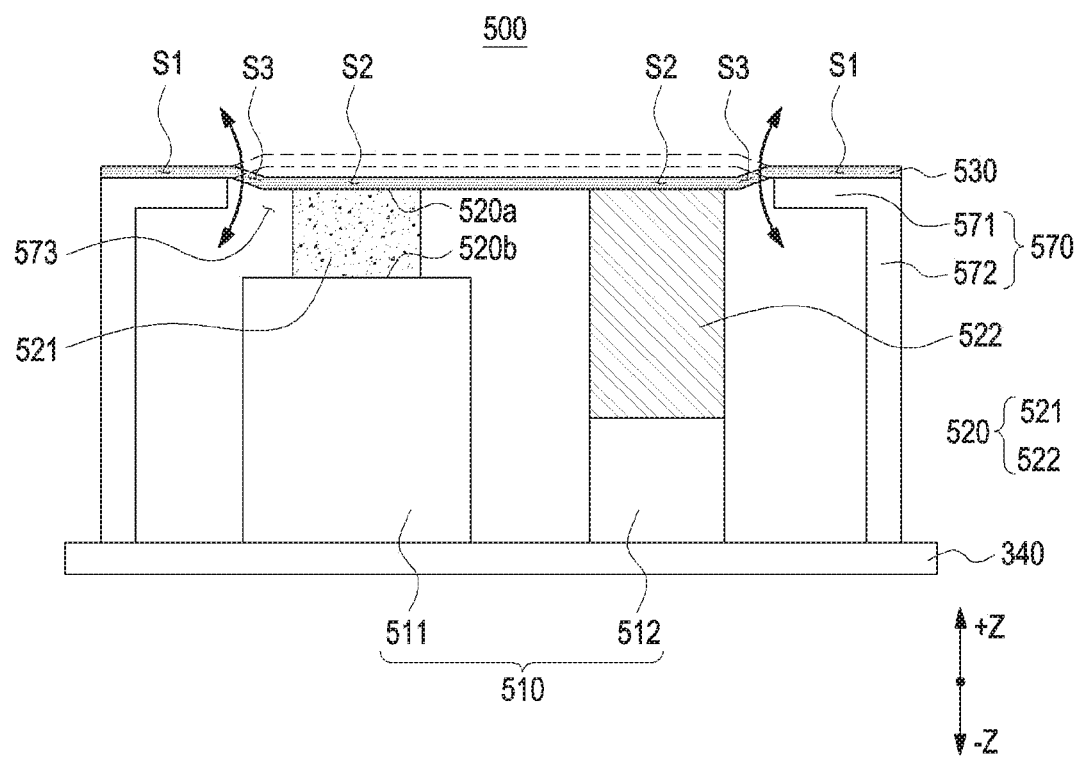
FIG. 7 is a cross-sectional view schematically illustrating an up/down operation of a shielding sheet, according to an embodiment.

FIG. 5 is a cross-sectional view illustrating a structure for shielding and heat-radiation around an electric component, according to an embodiment. FIG. 6 is a cross-sectional view illustrating a structure for shielding and heat-radiation around an electric component, according to an embodiment. FIG. 7 is a cross-sectional view schematically illustrating an up/down operation of a shielding sheet, according to an embodiment.

An electronic device may include a printed circuit board 340 (hereinafter, circuit board 340 or PCB 340), at least one electric component 510, at least one heat transfer member 520, a shielding sheet 530, and a shield can 570. The electronic device 101 may further include at least one heat radiating member 540 and a cooling member 560. The circuit board 340 of FIGS. 5 to 7 may be wholly or partially identical in configuration to the PCB 340 of FIG. 4.

In FIGS. 5, 6, and 7, or '+Z or −Z' may denote an upper or lower direction as viewed from above a side surface of the heat radiating structure 500. '+Z' may mean a forward direction which is a direction in which the electric component 510 inside the electronic device faces the front cover, and '−Z' may mean a backward direction which is a direction in which the electric component 510 inside the electronic device faces the back cover.

A plurality of electric components may be disposed on at least one side surface of the circuit board 340. Among the plurality of electric components, an electric component 510 may be a heat source that generates heat and may be at least one chip which is disposed on at least one side surface of the circuit board 340. The at least one chip may include at least one of a PMIC, a power amplifier (PAM), an AP, a CP, a charger IC, or a direct-current (DC) converter. The electric component 510 may include a first electric component 511 and a second electric component 512. In this embodiment, the first electric component 511 may be an AP, and the second electric component 512 may be a PMIC.

The shield can 570 may be formed to surround at least a portion of the electric component 510. The shield can 570 may be mounted on one surface of the circuit board 340, with the electric component 510 received in the shield can 570. Alternatively, to prevent a portion of the shield can 570 from overlapping the electric component 510 as viewed from above the heat radiating structure 500 of the electronic device (e.g., as viewed in the second direction −Z), at least one opening (e.g., a first opening 573) may be formed in an area corresponding to the electric component 510. The first opening 573 may be formed in an area where at least a portion of the electric component 510 is positioned or may provide a space, where other material may contact. In a portion (e.g., the +Z direction) facing the electric component 510, thereby allowing for easier discharge of the heat generated from the electric component 510 to the outside.

The shield can 570 may be coupled to one surface (e.g., one surface facing in the first direction +Z) of the circuit board 340. At least a portion of one surface of the circuit board 340 and the shield can 570 may be coupled together by soldering. The shield can 570 may include an upper portion 571, where the first opening 573 is formed and a portion of the shielding sheet 530 is positioned, and a side portion 572 forming a space between the upper portion 571 and the circuit board 340. The first opening 573 may provide a path along which the heat generated from the electric component 510 flows, and the shield can 570 may be formed in a shape (e.g., a closed rectangular loop) surrounding at least a portion of the electric component 510.

The shielding sheet 530 may be disposed on at least a portion of the shield can 570. The shielding sheet 530 may provide the function of shielding off electromagnetic waves that may be generated from the electric component 510 and a heat conducting function for transferring the heat which may be generated from the electric component 510 to the outside of the electric component 510. The shielding sheet 530 may be disposed to cover at least a portion of the first opening 573 of the shield can 570 to shield off the electromagnetic waves from the electric component 510. The shielding sheet 530 may be disposed along the portion, where the first opening 573 is formed, and the surroundings of the first opening 573, on a side surface (e.g., the top surface (or the surface facing in the +Z direction) of the shield can 570.

The shielding sheet 530 may have a flexible structure. The shielding sheet 530 may include a first area S2 disposed in at least a portion of the shield can 570, a second area S2 disposed to face the heat transfer member 520, and a third area S3 extending from the first area S1 to the second area S2 and forming a designated inclined surface or curved surface. The third area S3 may form an inclined surface or a, at least partially curved surface, to compensate for the height difference of the shielding sheet 530 disposed on the top surface of the heat transfer member 520 and the shield can 570.

The flexible structure of the shielding sheet 530 may overall cover a plurality of components (e.g., the first electric component 511 and the second electric component 512) with different heights on the circuit board 340. Preforming may be performed using a silicone compressing jig to cover the shield can 570 and/or components with different heights, thereby providing a structure with an inclined surface or curved surface. As another example, the shielding sheet 530 may provide a three-dimensional (3D) shape (e.g., a conformal type) structure to be able to encapsulate various sizes and shapes of components disposed on the circuit board 340 in one sheet and may thereby provide a shielding function.

The shielding sheet 530 may be formed by stacking a plurality of layers. The shielding sheet 530 may include a shielding film and a conductive adhesive film. The shielding film may be a fiber film which is formed in a nano structure to shield electromagnetic waves. The fiber film may be formed thin and long by electrospinning fiber, and the so-formed fiber may be plated with Cu and then nickel (Ni) and then and lastly with Cu. The fiber film may be implemented in a nano structure which is formed by folding several times the fiber layers formed by such plating. The shielding film may be formed to have a thickness of about 5 micrometers (μm) to about 20 μm. The conductive adhesive films may be disposed to face each other, with the shielding film interposed therebetween. The conductive adhesive films are disposed to adhere with the heat radiating sheets (e.g., the heat transfer member 520) adjacent to the shielding sheet 530, may include Ni, and be formed with a thickness of about 5 μm to about 15 μm. If the shielding film and the heat radiating sheet are directly adhered by one of the conductive adhesive films, heat transfer may be enhanced as compared with when they are spaced apart or other foreign body intervenes. If they are spaced apart or a foreign body intervenes, or an air gap is formed, heat transfer may not efficiently work. In contrast, if they are adhered together directly without a foreign body or an air gap, the heat generated from the electric component 510 may be efficiently transferred directly via the shielding sheet 530 to the outside. The shielding sheet 530 may add an aluminum layer and an insulation coating layer stacked. The heat generated from the electric component 510 may pass through the first opening 573 of the shield can 570 and be then transferred to other layer via the shielding sheet 530.

The shielding sheet 530 may include an elastic material so that it may be compressed when a pressure is applied thereto due to an external impact. The shielding sheet 530, along with the heat transfer member 520 with an elastic material, may provide movement along the second direction −Z which is towards the electric component 510, and its opposite direction, i.e., the first direction +Z. Thus, when an external pressure is applied due to an external impact, the electric component 510 may be prevented from receiving a direct impact.

The heat transfer member 520 may be disposed between the electric component 510 and the shielding sheet 530, transferring the heat generated from the electric component 510 to the shielding sheet 530. The heat transfer member 520 may be disposed so that at least a portion thereof passes through the first opening 573 of the shield can 570. The first surface 520a facing in the first direction +Z may be adhered to a partial area (e.g., one lower surface) of the shielding film by the conductive adhesive film of the shielding sheet 530, and the second surface 520b facing in the second direction −Z may be disposed to directly contact at least a portion of the electric component 510.

The heat transfer member 520 may be formed of a carbon fiber thermal interface material (TIM) which may be able to transfer the heat generated from the electric component 510. However, the heat transfer member 520 is not limited to the carbon fiber TIM but may rather include various heat radiating materials or members for transferring the heat generated from the electric component 510 to the outside or the cover of the electronic device. The heat transfer member 520 may include a TIM, a heat pipe, a vapor chamber, a heat radiating sheet, or a heat radiating paint. Here, the heat-radiating sheet or heat-radiating paint may include graphite, carbon nano tube (CNT), natural recyclable substance, silicone, silicon, or other high thermal conducting substance. The carbon fiber TIM may include at least one of a liquid phase TIM and/or a solid phase TIM.

There may be provided a plurality of heat transfer members 520 which include a first heat transfer member 521 disposed to contact the first electric component 511 and a second heat transfer member 522 disposed to contact the second electric component 512. If the first electric component 511 is an AP, the first heat transfer member 521 may be a carbon fiber TIM and, if the second electric component 512 is a PMIC, the second heat transfer member 522 may be an acrylic TIM. The first heat transfer member 521 and the second heat transfer member 522 may have different heights. When the first electric component 511 has a relatively larger thickness than the second electric component 512, the first heat transfer member 521 disposed on the first electric component 511 may be formed with a smaller thickness than the second heat transfer member 522 disposed on the second electric component 512. Thus, the total height of the electric component 510 and the heat transfer member 520 may be constant or substantially constant, and the shielding sheet 530 disposed to extend from the first heat transfer member 521 to one surface of the second heat transfer member 522 may stay flat.

The slope or, shape of curved surface, of the third area S3 of the shielding sheet 530 may be varied depending on the compression rate of the first heat transfer member 521. Referring to FIG. 5, if the heat transfer member 520 with a relatively high compression rate is used as compared with the heat transfer member of FIG. 6, the second area S2 of the shielding sheet 530 may be positioned lower than the first area S1 when determined with respect to the Z axis. Thus, the slope of the third area S3 may form an inclined surface which gets lower from the first area S1 to the second area S2. Referring to FIG. 6, if the heat transfer member 520 with a relatively low compression rate is used as compared with the heat transfer member of FIG. 5, the second area S2 of the shielding sheet 530 may be positioned higher than the first area. S1 when determined with respect to the Z axis. Thus, the slope of the third area S3 may form an inclined surface which gets higher from the first area S1 to the second area S2.

The heat transfer member 520, along with the shielding sheet 530, may be formed to be movable in the second direction −Z which is towards the electric component 510 and its opposite direction, i.e., the first direction +Z. Referring to FIG. 7, the first area S1 fixed to the controller 445 may support the overall shielding sheet 530, and the second area S2, together with the heat transfer member 520, may be moved up or down in the direction perpendicular to the circuit board 340. The third area S3 may be disposed between the first area S1 and the second area S2, guide the second area S2 to move vertically, and form an inclined surface which gets higher or lower according to the position of the second area S2. The shielding sheet 530 and the heat transfer member 520 may be formed of an elastic material. Thus, if an external force is applied due to an external impact, the electric component 510 may be prevented from a direct impact.

The heat radiating member 540 may be disposed so that at least one surface thereof contacts the shielding sheet 530. The heat radiating member 540 may be disposed between a cover (e.g., the front cover or rear cover) of the electronic device and the electric component 510 and be formed of a high-thermal conductivity material to effectively receive the heat from the electric component 510. The heat radiating member 540 may include at least one of a material including boron nitride (BN) or a material including a graphite sheet or polyurethane (PU). The heat radiating member 540 may include BN based aluminum (e.g., BN-based Al with adhesive).

The heat radiating member 540 may be formed to have an area corresponding to the heat transfer member 520. The heat radiating member 540 may be disposed to face the heat transfer member 520 with the second area S2 of the shielding sheet 530 interposed therebetween. The heat radiating member 540 may include a conductive adhesive layer. The conductive adhesive layer may be adhered to one surface of the second area S2, stably and quickly transferring the heat generated from the electric component 510 to other material (e.g., the cooling member 560).

The heat radiating member 540 may be provided for each of a plurality of electric components to collect the heat generated from each electric component 510 and to provide the collected heat to one sheet (e.g., the cooling member 560). There may be provided a plurality of heat radiating members 540 which include a first heat radiating member 541 disposed to face the first heat transfer member 521 and a second heat radiating member 542 disposed to face the second heat transfer member 522. The first heat radiating member 541 and the second heat radiating member 542 may compensate for the tolerances between the shielding sheet 530 and other structures and may support one surface of the movable shielding sheet 530.

The cooling member 560 may be disposed so that at least one surface thereof contacts the shielding sheet 530 or the heat radiating member 540. The cooling member 560 may be disposed between a cover (e.g., the front cover or rear cover) of the electronic device and the shielding sheet 530 and be formed of a high-thermal conductivity material to effectively receive the heat from the electric component 510. The cooling member 560 may include a water cooling-type heat spreading member such as a heat pipe or vapor chamber.

One surface of the cooling member 560 may be disposed to contact a partial area where a plurality of heat radiating members 540 is arranged. The heat collected from the electric components 510 via the plurality of heat radiating members 540 may be transferred to the cooling member 560 which has a large area and be thus quickly discharged to the outside.

Referring back to FIGS. 5 and 6, the heat generated from the electric component 510 may be efficiently transferred via the heat radiating structure 500 to the cover or outside of the electronic device. The heat from the electric component 510 may be transferred to the heat transfer member 520 which contacts the electric component 510. The heat transfer member 520 passes through the first opening 573 of the shield can 570, transferring the transferred heat to the shielding sheet 530. The heat transferred to the shielding sheet 530 may be collected via the heat radiating member 540 and be transferred to the cooling member 560. There may be provided a plurality of heat radiating members 540 which may collect the heat transferred from the plurality of electric components 510 and then spread the heat via the large-area cooling member 560.

The heat radiating structure 500 lacks a support layer (e.g., a Cu plate) which is adopted for conventional heat radiating structures and has the heat transfer member 520, which has superior heat transfer effects, placed in contact with the electric component 510, thus quickly spreading the heat generated from the electric component 510 to the outside of the electronic device and hence cooling down the surroundings of the electric component 510. Further, a portion of the heat transfer member 520 is disposed to directly contact at least a portion of the shielding sheet 530. The shielding sheet 530 is disposed to cover the overall top surface of the shield can 570, thereby reducing the overall thickness of the heat radiating structure 500.

Figure 8:
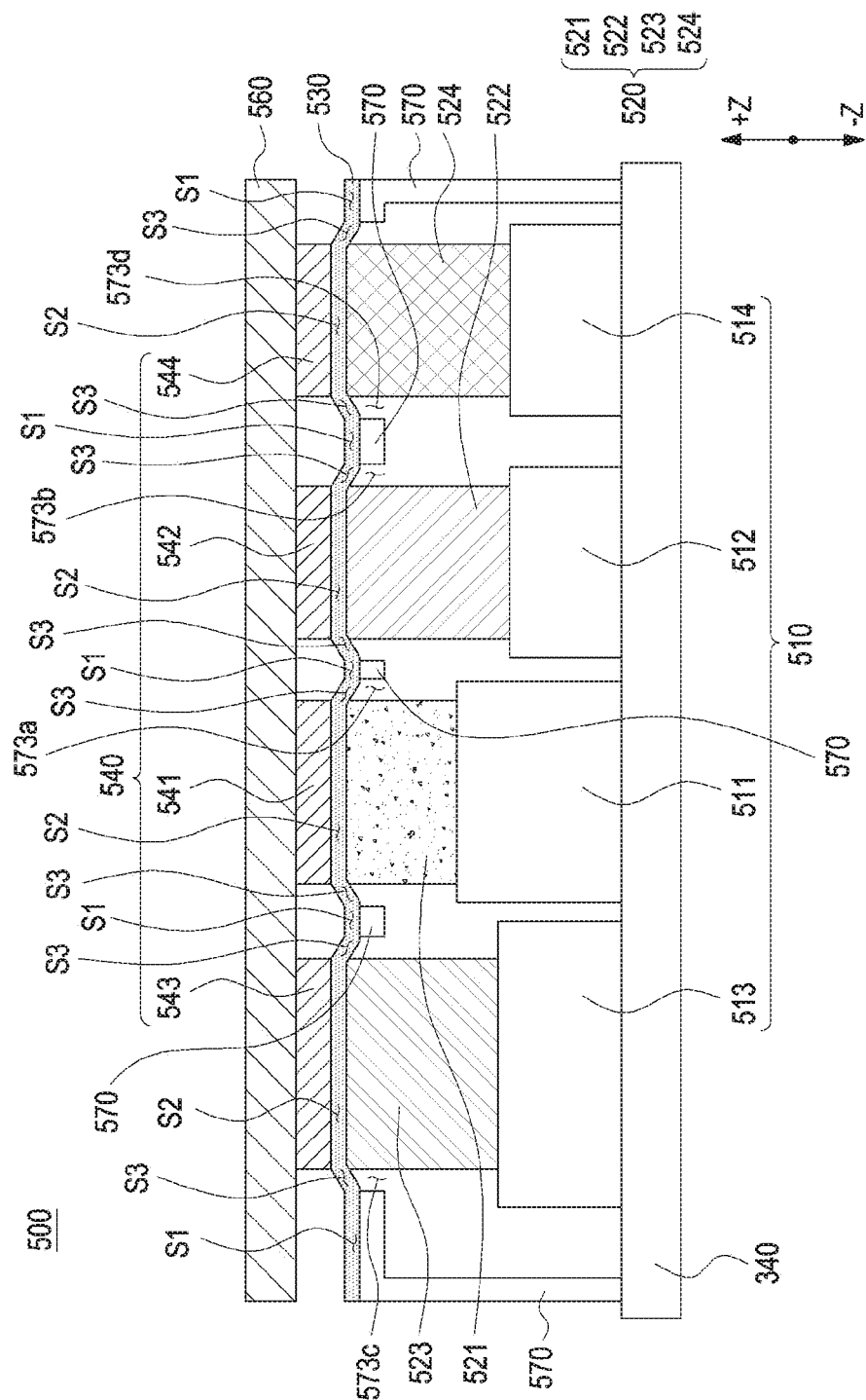
FIG. 8 is a cross-sectional view illustrating a structure for shielding and heat-radiation around an electric component, according to an embodiment.

FIG. 8 is a cross-sectional view illustrating a structure for shielding and heat-radiation around an electric component, according to an embodiment.

An electronic device may include a circuit board 340, at least one electric component 510, at least one heat transfer member 520, a shielding sheet 530, and a shield can 570. The electronic device 101 may further include at least one of at least one heat radiating member 540 and a cooling member 560.

In FIG. 8, or '+Z or −Z' may mean a direction as viewed from above a side surface of the heat radiating structure 500. '+Z' may mean a forward direction which is a direction in which the electric component 510 inside the electronic device faces the front cover, and '−Z' may mean a backward direction which is a direction in which the electric component 510 inside the electronic device faces the back cover.

The circuit board 340 of FIG. 8 may be wholly or partially identical in configuration to the PCB 340 of FIG. 5. At least one electric component 510, at least one heat transfer member 520, shielding sheet 530, heat radiating member 540, cooling member 560, and shield can 570 of FIG. 8 may be wholly or partially identical in configuration to the at least one electric component 510, at least one heat transfer member 520, shielding sheet 530, heat radiating member 540, cooling member 560, and shield can 570 of FIG. 5.

The following description focuses primarily on a plurality of electric components and the heat transfer member 520 and heat radiating member 540 disposed corresponding thereto, which differ from those of FIG. 5.

A plurality of electric components may be disposed on at least one side surface of the circuit board 340. Electric components 510 may include a first electric component 511, a second electric component 512, a third electric component 513, and a fourth electric component 514 which may be received in one shield can 570. The first electric component 511 may be an AP, the second electric component 512 may be a PMIC, the third electric component 513 may be a CP, and the fourth electric component 514 may be a DC converter.

The shield can 570 may be formed to surround at least a portion of the electric component 510. The shield can 570 may be mounted on one surface (e.g., a surface facing in the Z direction) of the circuit board 340, with the electric components 510 received in the shield can 570. The shield can 570 may have a separate opening in the position corresponding to each electric component 510. A first opening 573a may be formed in a position corresponding to the first electric component 511, a second opening 573b may be formed in a position corresponding to the second electric component 512, a third opening 573c may be formed in a position corresponding to the third electric component 513, and a fourth opening 573d may be formed in a position corresponding to the fourth electric component 514.

The heat transfer member 520 may be disposed between the electric component 510 and the shielding sheet 530, forming a heat transfer path for transferring the heat generated from the electric component 510 to the shielding sheet 530. There may be provided a plurality of heat transfer members 520 which include a first heat transfer member 521 disposed to contact the first electric component 511, a second heat transfer member 522 disposed to contact the second electric component 512, a third heat transfer member 523 disposed to contact the third electric component 513, and a fourth heat transfer member 524 disposed to contact the fourth electric component 514. The first heat transfer member 521 and the third heat transfer member 523 may be carbon fiber TIMs, and the second heat transfer member 522 and the fourth heat transfer member 524 may be acrylic TIMs. The first heat transfer member 521 to the fourth heat transfer member 524 may have different heights. When the first electric component 511 has a relatively larger thickness than the second electric component 512, the first heat transfer member 521 disposed on the first electric component 511 may be formed with a smaller thickness than the second heat transfer member 522 disposed on the second electric component 512.

The shielding sheet 530 may be disposed on at least a portion of the shield can 570. The shielding sheet 530 may provide a shielding function for electromagnetic waves that may be generated from the electric component 510. The shielding sheet 530 may be disposed to cover the first opening 573a, second opening 573b, third opening 573c, and fourth opening 573d of the shield can 570 to shield of electromagnetic waves from the plurality of electric components 510.

The shielding sheet 530 may have a flexible structure. The shielding sheet 530 may include a first area S2 disposed in at least a portion of the shield can 570, a second area S2 disposed to face the heat transfer member 520, and a third area S3 extending from the first area S to the second area S2 and forming a designated inclined surface or curved surface. The third area S3 may form an inclined surface or an at least partially curved surface to compensate for the height difference of the shielding sheet 530 disposed on the top surface of the heat transfer member 520 and the shield can 570.

The heat radiating member 540 may be disposed so that at least one surface thereof contacts the shielding sheet 530. There may be formed a plurality of heat radiating members 540 each of which has an area corresponding to each heat transfer member 520. The plurality of heat radiating members 540 may be disposed to face the heat transfer member 520 with the second region S2 of the shielding sheet 530 interposed therebetween. The heat radiating member 540 may include a conductive adhesive layer. The conductive adhesive layer may be adhered to one surface (e.g., the surface facing in the +Z direction) of the second area S2, stably and quickly transferring the heat generated from the electric component 510 to other material (e.g., the cooling member 560).

The heat radiating member 540 may be provided for each of a plurality of electric components to collect the heat generated from each electric component 510 and to provide the collected heat to one sheet (e.g., the cooling member 560). There may be provided a plurality of heat radiating members 540 which include a first heat radiating member 541 disposed to face the first heat transfer member 521, a second heat radiating member 542 disposed to face the second heat transfer member 522, a third heat radiating member 543 disposed to face the third heat transfer member 523, and a fourth heat radiating member 544 disposed to face the fourth heat transfer member 524. The first heat radiating member 541 to the fourth heat radiating member 544 may compensate for the tolerances between the shielding sheet 530 and other structures and may support one surface of the movable shielding sheet 530.

The cooling member 560 may be formed in an area corresponding to the shielding sheet 530 and may be disposed to contact a partial area where a plurality of heat radiating members 540 are arranged.

Figure 9:
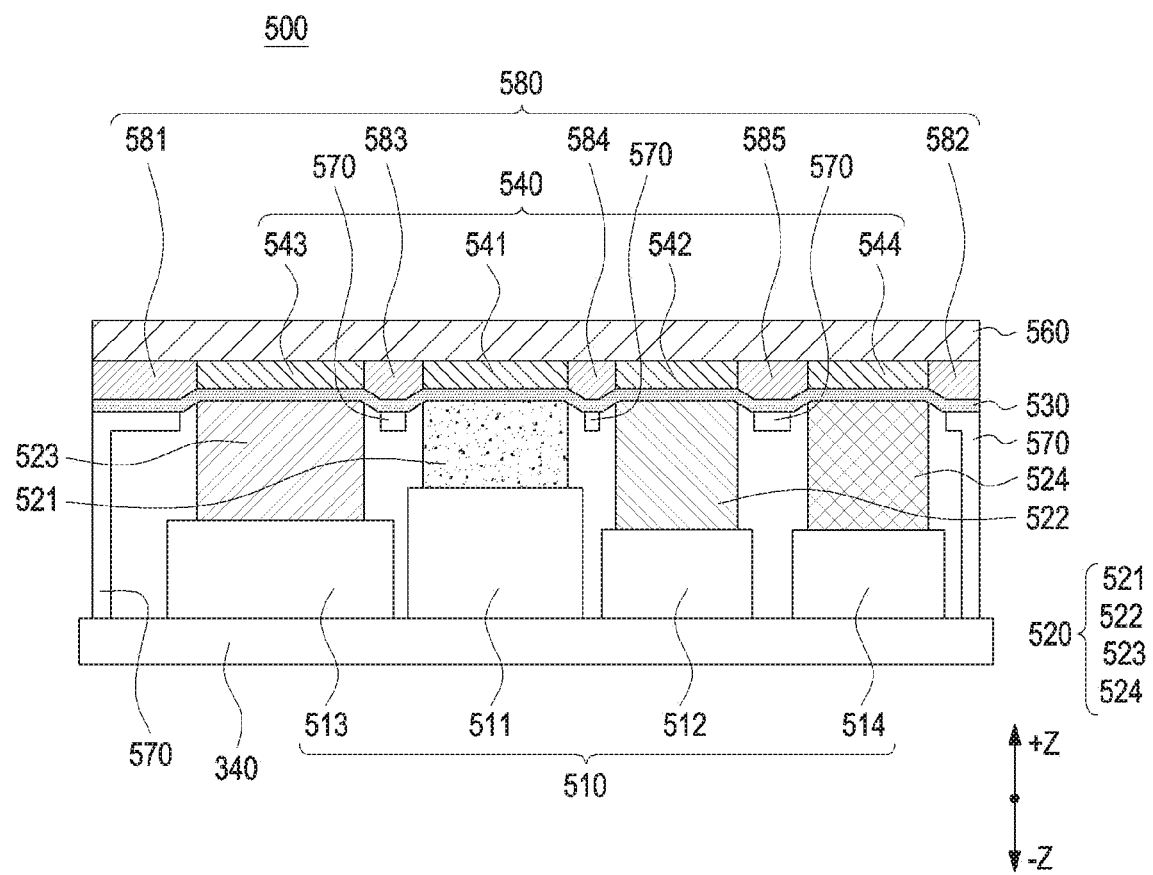
FIG. 9 is a cross-sectional view illustrating a structure for shielding and heat-radiation around an electric component, according to an embodiment.

FIG. 9 is a cross-sectional view illustrating a structure for shielding and heat-radiation around an electric component, according to an embodiment.

An electronic device may include a circuit board 340, at least one electric component 510, at least one heat transfer member 520, a shielding sheet 530, and a shield can 570. The electronic device 101 may further include at least one heat radiating member 540, a cooling member 560, and a magnetic member 580.

In FIG. 9, '+Z or −Z' may mean a direction as viewed from above a side surface of the heat radiating structure 500. '+Z' may mean a forward direction which is a direction in which the electric component 510 inside the electronic device faces the front cover, and '−Z' may mean a backward direction which is a direction in which the electric component 510 inside the electronic device faces the back cover.

The circuit board 340 of FIG. 9 may be wholly or partially identical in configuration to the PCB 340 of FIG. 8. At least one electric component 510, at least one heat transfer member 520, shielding sheet 530, heat radiating member 540, cooling member 560, and shield can 570 of FIG. 9 may be wholly or partially identical in configuration to the at least one electric component 510, at least one heat transfer member 520, shielding sheet 530, heat radiating member 540, cooling member 560, and shield can 570 of FIG. 8.

The following description focuses primarily on the magnetic member 580 disposed between the heat radiating members, which differs from that of FIG. 8.

The magnetic member 580 may be disposed in an area (e.g., the first area S1 of FIG. 8) where the shield can 570 contacts the shielding sheet 530. The magnetic member 580 may be disposed in a portion between the cooling member 560 and the shielding sheet 530. The magnetic member 580 may be disposed between a plurally of heat radiating members 540. As viewed from above the heat radiating structure 500 of the electronic device (e.g., as viewed in the −Z direction), the magnetic member 580 may be disposed not to overlap the heat radiating member 540 and be formed to include magnetic particles for shielding low-frequency noise. The magnetic particles may include at least one of an absorber, a nano crystal, or an amorphous metal. However, embodiments of the disclosure are not limited thereto but other various magnetic particles for shielding may be included.

There may be provided a plurality of magnetic members 580, which may include a first magnetic member 581 and a second magnetic member 582 exposed to the outside of the heat radiating structure 500 and disposed on the respective sides of the third heat radiating member 543 and the fourth heat radiating member 544. The plurality of magnetic members 580 may include a third magnetic member 583 disposed between the third heat radiating member 543 and the first heat radiating member 541, a fourth magnetic member 584 disposed between the first heat radiating member 541 and the second heat radiating member 542, and a fifth magnetic member 585 disposed between the second heat radiating member 542 and the fourth heat radiating member 544. The first magnetic member 581 to the fifth magnetic member 585 may compensate for the tolerances between the shielding sheet 530 and other structures and may support one surface of the movable shielding sheet 530.

Figure 10:
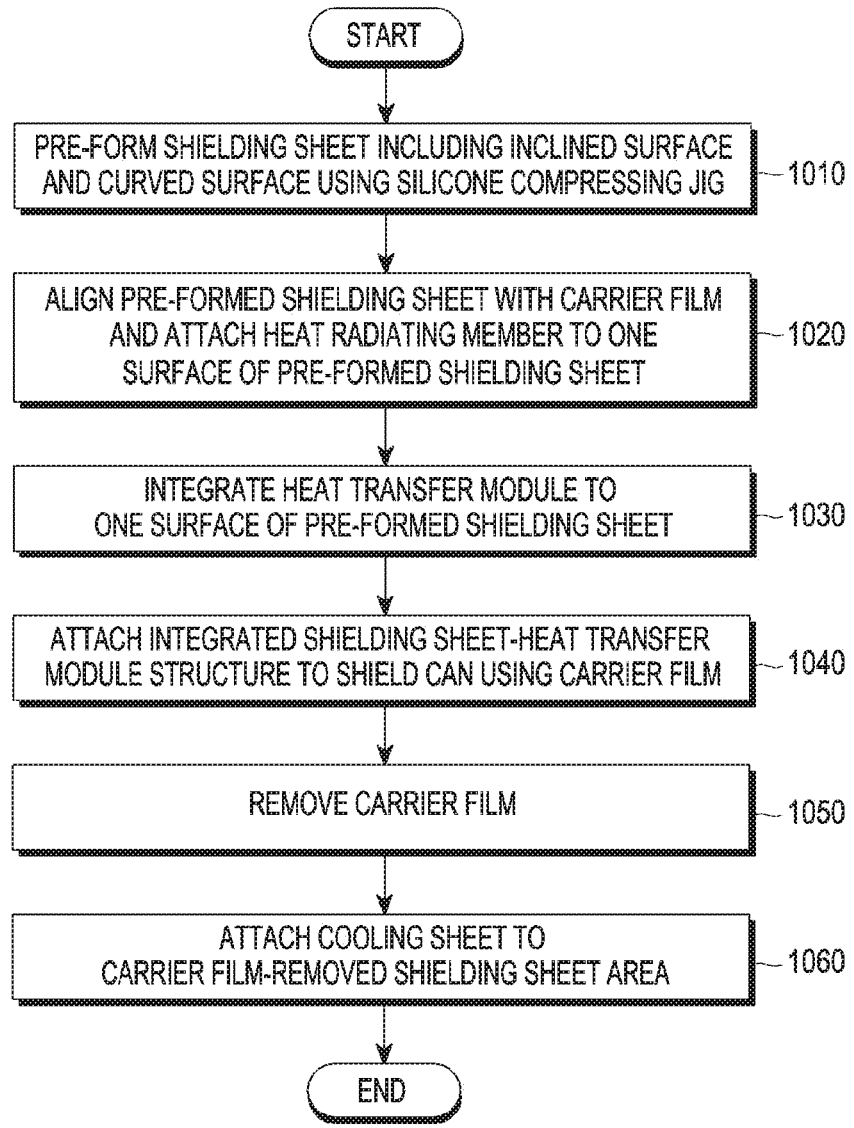
FIG. 10 is a flowchart illustrating a method of manufacturing a heat radiating structure, according to an embodiment.
Figure 11:
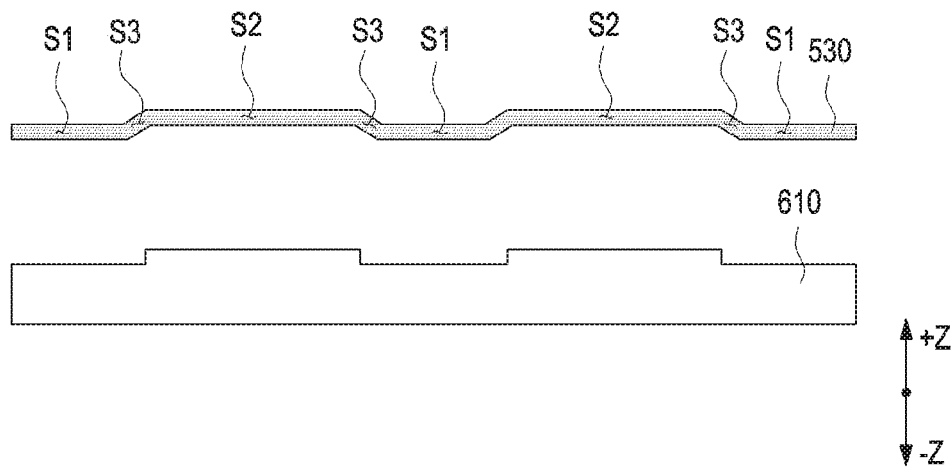
FIGS. 11, 12, 13, 14, 15, and 16 are views schematically illustrating the steps of FIG. 10, according to an embodiment.

FIG. 10 is a flowchart illustrating a method of manufacturing a heat radiating structure, according to an embodiment, FIGS. 11, 12, 13, 1.4, 15, and 16 are views schematically illustrating the operations of FIG. 10, according to an embodiment.

An electronic device may include a circuit board 340, at least one electric component 510, at least one heat transfer member 520, a shielding sheet 530, and a shield can 570. The electronic device 101 may further include at least one of at least one heat radiating member 540 and a cooling member 560.

The circuit board 340 of FIGS. 11 to 16 may be wholly or partially identical in configuration to the PCB 340 of FIG. 4. At least one electric component 510, at least one heat transfer member 520, shielding sheet 530, heat radiating member 540, cooling member 560, and shield can 570 of FIGS. 11 to 16 may be wholly or partially identical in configuration to the at least one electric component 510, at least one beat transfer member 520, shielding sheet 530, heat radiating member 540, cooling member 560, and shield can 570 of FIGS. 5 to 7.

The shielding sheet 530 used in the heat radiating structure 500 may have a specific shape which may be implemented by pre-forming using a jig. At step 1010 of FIGS. 10 and 11, there may be implemented a shielding sheet 530 with a structure including an inclined surface or curved surface to be able to cover the shield can 570 and/or components with different heights, using a silicone compressing jig 610. The shielding sheet 530 may have a flexible structure. The shielding sheet 530 may include a first area S2 for being disposed in at least a portion of the shield can 570, a second area S2 for being disposed to face the heat transfer member 520, and a third area S3 extending from the first area S1 to the second area S2 and forming a designated inclined surface or curved surface. The shielding sheet 530 may provide a 3D shape (e.g., a conformal type) structure to be able to encapsulate various sizes and shapes of components disposed on the circuit board 340 in one sheet and may thereby provide a shielding function.

Figure 12:
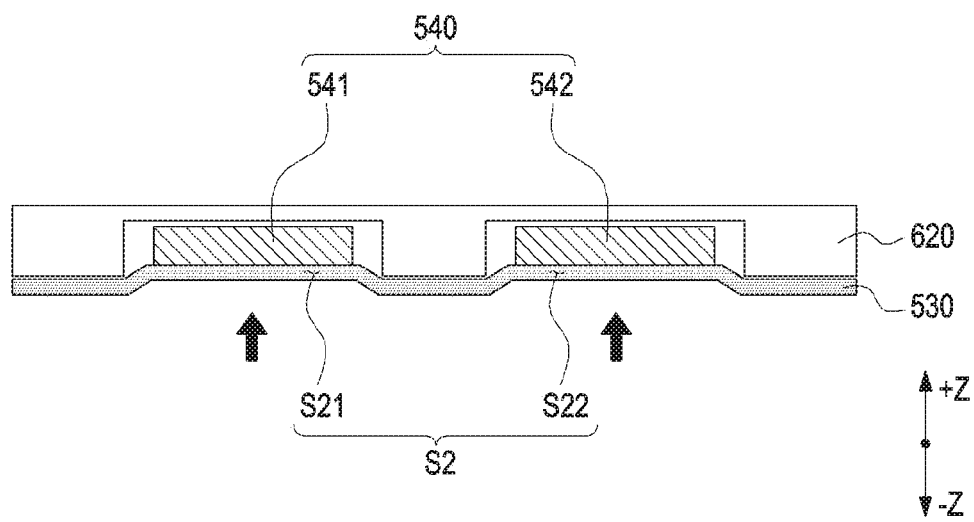

Thereafter, at step 1020 of FIGS. 10 and 12, the pre-informed shielding sheet 530 and a carrier film 620 may be aligned to each other, and the heat radiating member 540 may be attached to one surface of the pre-formed shielding sheet 530.

The heat radiating member 540 may be attached to one surface, facing in the first direction +Z, of the pre-formed shielding sheet 530. In the heat radiating structure, the heat radiating member 540 may function to collect the heat spreading in the first direction +Z. The heat radiating member 540 may include at least one of a material including BN or a material including a graphite sheet or YU. As another example, the heat radiating member 540 may include BN based aluminum (e.g., BN-based AI with adhesive).

The heat radiating member 540 may be positioned in the second area S2 of the shielding sheet 530. There may be provided a plurality of heat radiating members 540 spaced apart from each other. The heat radiating members 540 may be configured to be positioned corresponding to their respective ones of the plurality of electric components 510 disposed on the circuit board 340. There may also be provided a plurality of second areas S2 of the shielding sheet 530, which correspond to the plurality of heat radiating members 540. The first heat radiating member 541 may be disposed on the top surface of a second-first area S21, and the second heat radiating member 542 may be disposed on the top surface of a second-second area S22.

The carrier film 620 may be a film for processing and may be used in a process for implementing the heat radiating structure but may be later removed from the electronic device. The carrier film 620 may play a role to apply pressure to allow the heat radiating member 540 to be attached to the shielding sheet 530 when attached using a jig in a surface mount device (SMD) process.

Figure 13:
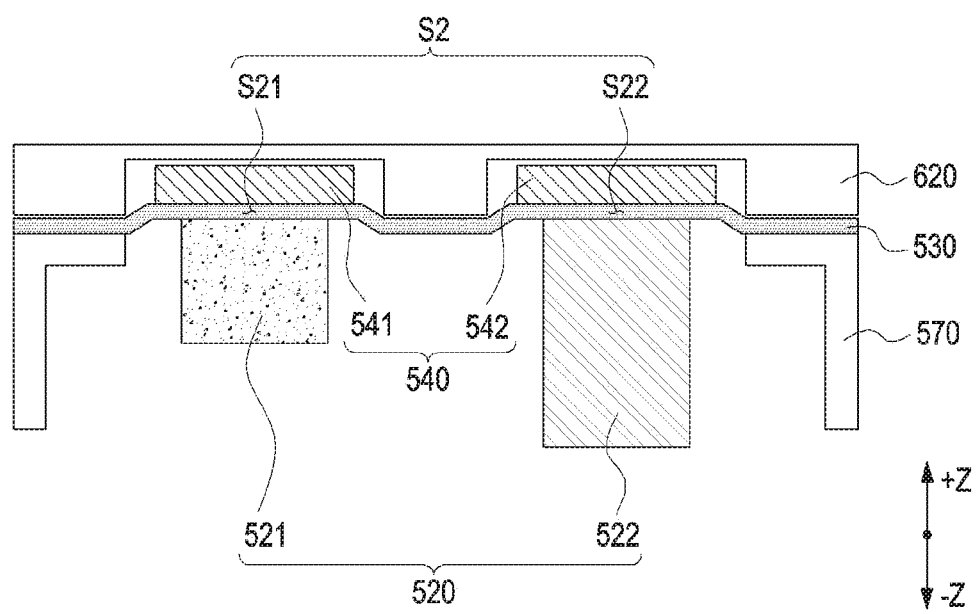

Then, at step 1030 of FIGS. 10 and 13, the heat transfer member 520 may be integrated onto one surface of the pre-formed shielding sheet 530.

The heat transfer member 520 may be attached to one surface, facing in the second direction −Z, of the pre-formed shielding sheet 530. The shielding sheet 530 may include a shielding film and a conductive adhesive film. The heat transfer member 520 may directly be adhered using the conductive adhesive film, thereby enhancing heat transfer efficiency.

The heat transfer member 520 may be positioned in the second area S2 of the shielding sheet 530. The heat radiating member 540 may be positioned in the first direction +Z with respect to the shielding sheet 530, and the heat transfer member 520 may be positioned in the second direction −Z so that they may face each other.

There may be provided a plurality of heat transfer members 520 and a plurality of second areas S2 of the shielding sheet 530 may be formed corresponding thereto. The first heat transfer member 521 may be disposed on the bottom surface (e.g., the second direction −Z) of the second-first area S2, and the second heat transfer member 522 may be disposed on the bottom surface of the second-second area S2. The heat transfer member 520 may be formed of a carbon fiber TIM which may be able to transfer the heat generated from the electric component 510. However, the heat transfer member 520 is not limited to the carbon fiber TIM but may rather include various heat radiating materials or members for transferring the heat generated from the electric component 510 to the outside or the cover of the electronic device.

Figure 14:
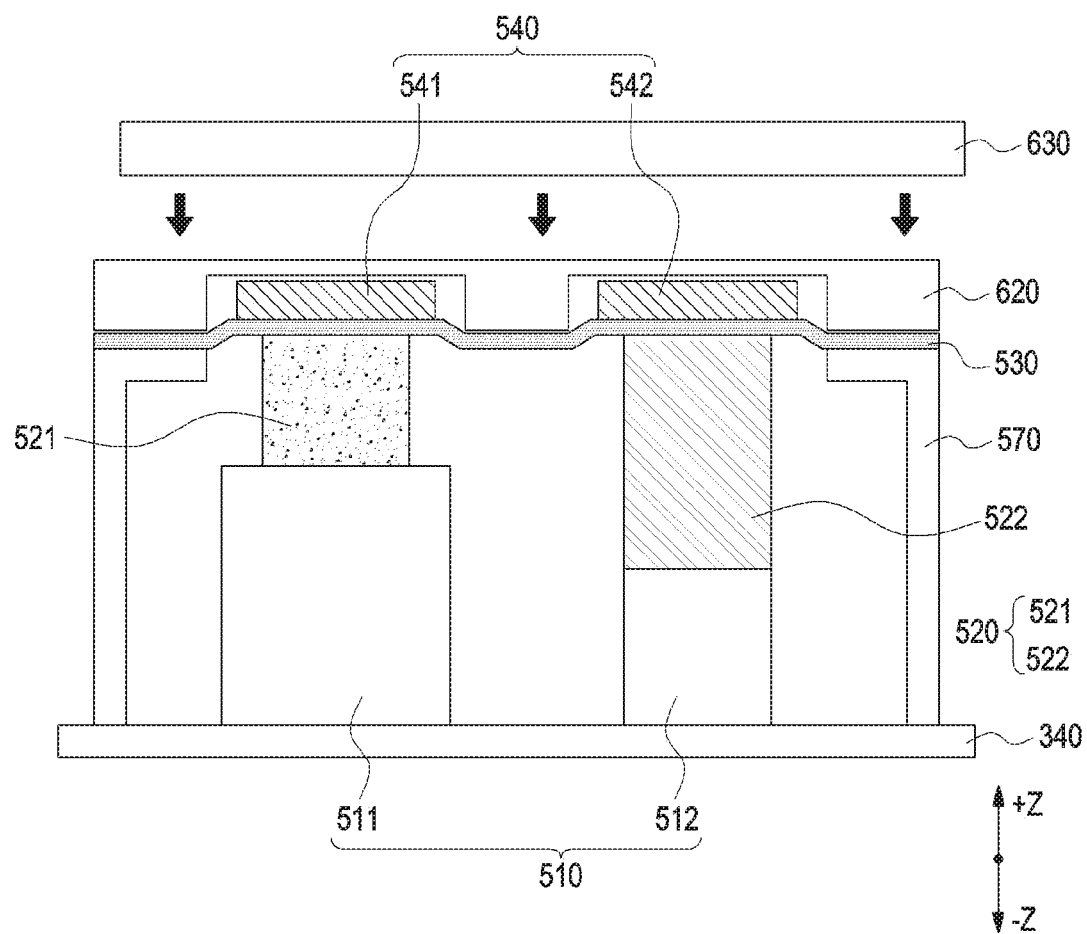

Thereafter, at step 1040 of FIGS. 10 and 14, the integrated shielding sheet 530-heat transfer member 520 structure may be attached to the shield can 570 and the electric component 510 using the carrier film 620 and a nozzle 630. The carrier film 620 may be pressurized via the nozzle 630 so that the bottom surface of the shielding sheet 530 may be attached to the top surface of the shield can 570, and the bottom surface of the heat transfer member 520 may be attached to the top surface of the electric component 510.

The integrated shielding sheet 530-heat transfer member 520 structure and the carrier film 620 may be manufactured, with them attached together, and may then be moved for additional processing in another place. The integrated shielding sheet 530-heat transfer member 520 structure and the carrier film 620 may be contained in a packet capable of receiving them and stored and moved, with the reel rolled up. After moved to the place for additional processing, the packet and reel are removed, and the integrated shielding sheet 530-heat transfer member 520 structure and the carrier film 620 may be pressurized by the external nozzle 630 and may thereby be attached to the shield can 570 and the electric component 510.

While the integrated shielding sheet 530-heat transfer member 520 structure is attached to the shield can 570, the heat transfer member 520 may be positioned over the electric component 510 on the circuit board 340. Since the heat transfer member 520 is positioned in direct contact with the electric component 510, the heat generated from the electric component 510 may be quickly transferred. The plurality of heat transfer members 520 may be individually positioned at the plurality of electric components 510. The first heat transfer member 521 may be disposed in contact with the first electric component 511 (e.g., an AP), and the second heat transfer member 522 may be disposed in contact with the second electric component 512 (e.g., a PMIC). If the first electric component 511 and the second electric component 512 have separate thicknesses, the first heat transfer member 521 and the second heat transfer member 522 may be manufactured in different sizes to efficiently transfer the heat generated from the electric component 510 to the shielding sheet 530.

The heat radiating structure may provide the flexible shielding sheet 530 capable of covering the overall top surface (e.g., the first direction +Z) of the shield can 570 and, thus, the number of contact points for shielding may be reduced, allowing for ease of manufacture and better shielding performance.

Figure 15:
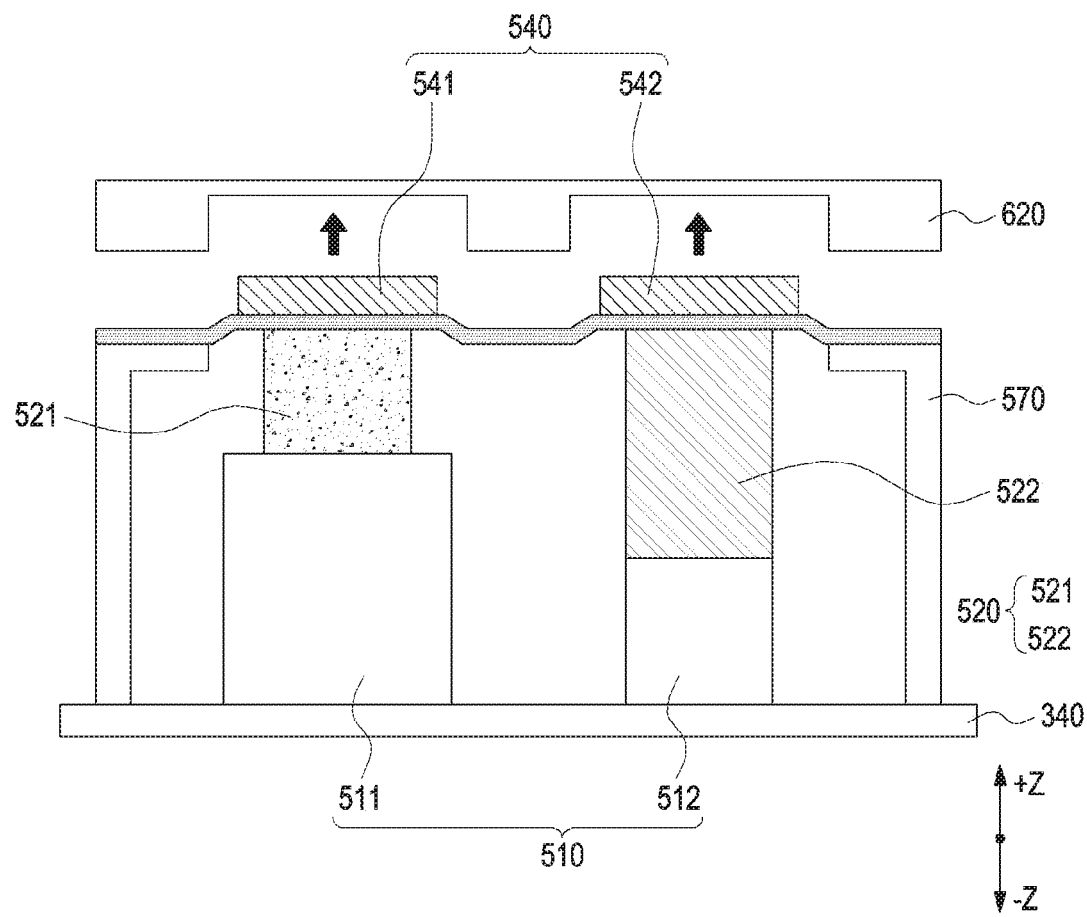

Then, at step 1050 of FIGS. 10 and 15, the carrier film 620 may be detached and removed. The carrier film 620 is provided for the purpose of operation and may not be positioned inside the electronic device.

Figure 16:
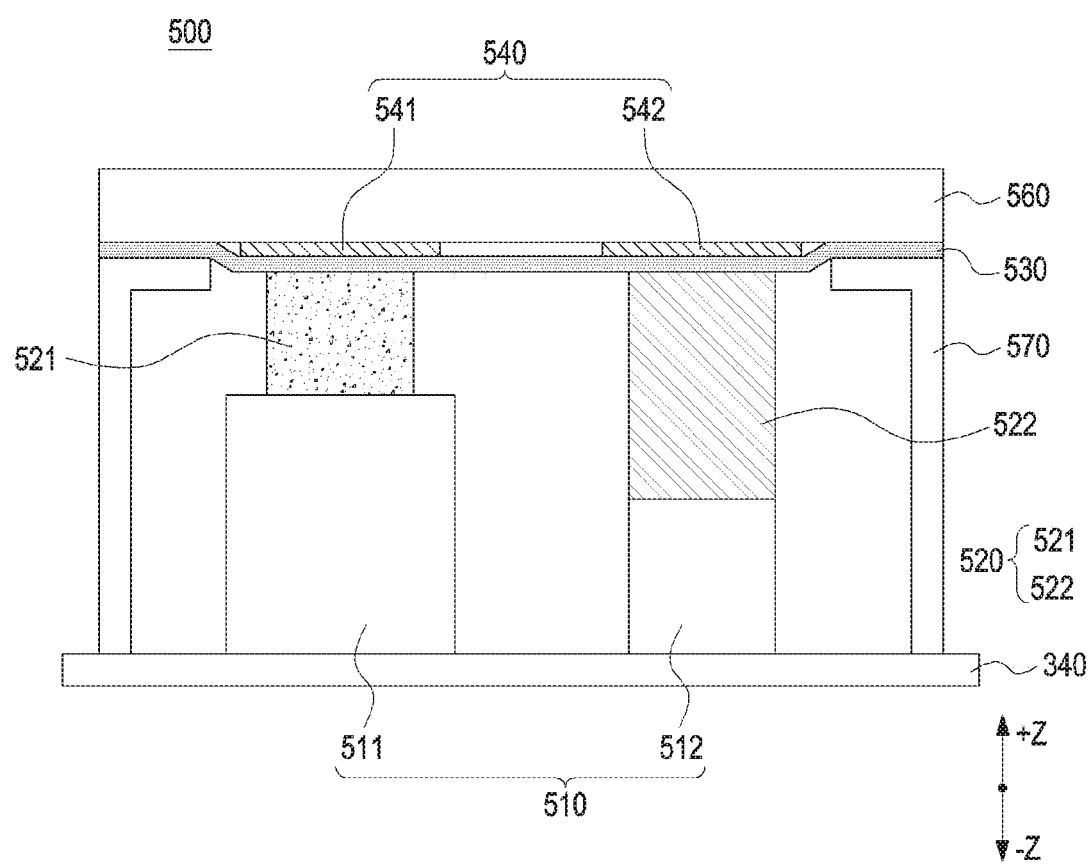

Then, at step 1060 of FIGS. 10 and 16, the cooling member 560 may be attached to the carrier film 620-removed shielding sheet area.

The cooling member 560 may be disposed on the shielding sheet 530 and the heat radiating member 540 and be attached by being pressurized in the second direction −Z. By the pressurization, the integrated shielding sheet 530-heat transfer member 520 structure containing an elastic material may be compressed and, without an airgap, stay compressed.

The cooling member 560 may be formed of a material with high thermal conductivity to effectively receive the collected heat from the plurality of heat radiating members 540. The cooling member 560 may include a water cooling-type heat spreading member, such as a heat pipe or vapor chamber and, as another example, the cooling member 560 may include a metal plate, such as a Cu plate.

According to an embodiment, an electronic device includes a circuit board, at least one electric component disposed on the one surface of the circuit board, a shield can mounted on one surface of the circuit board, with the at least one electric component received in the shield can, and including at least one opening formed in an area corresponding to the at least one electric component, a shielding sheet disposed in at least a portion of the shield can and blocking at least a portion of the at least one opening, and a heat transfer member disposed in contact between the at least one electric component and the shielding sheet. The shielding sheet may have a flexible structure. The shielding sheet may include a first area disposed in at least a portion of the shield can, a second area disposed on a top surface of the heat transfer member, and a third area extending from the first area to the second area and forming a designated inclined surface or curved surface. The shielding sheet and the heat transfer member are movable in a first direction towards the at least one electric component and in a second direction opposite to the first direction.

At least one of the shielding sheet and the heat transfer member may include an elastic material.

The shielding sheet may include a shielding film including a nano fiber structure and a conductive adhesive film disposed on at least one surface of the shielding film. The conductive adhesive film may adhere a bottom surface of the shielding film to the heat transfer member to form an integral structure of the shielding sheet and the heat transfer member.

The electronic device may further include a heat radiating member disposed to face the heat transfer member in the second area of the shielding sheet and collecting heat from the shielding sheet.

The heat radiating member may include a BN based aluminum.

The electronic device may further include a cooling sheet having at least one surface contacting the shielding sheet or the heat radiating member and formed to have an area corresponding to the shielding sheet. The cooling sheet may be at least one of a heat pipe or a vapor chamber.

At least a portion of the heat transfer member may be disposed to pass through the at least one opening of the shield can. The heat transfer member may directly transfer heat generated from the at least one electric component to the shielding sheet.

The heat transfer member may be at least one of a carbon fiber TIM or an acrylic TIM.

The at least one electric component may include a first electric component and a second electric component spaced apart from each other on the circuit board. The heat transfer member may include a first heat transfer member adhered onto the first electric component and a second heat transfer member adhered onto the second electric component.

The shielding sheet may provide a 3D shape structure to cause the at least one electric components disposed on the circuit board to be encapsulated in one sheet.

The heat radiating member may include a first heat radiating member facing the first heat transfer member, with the shielding sheet interposed therebetween, and a second heat radiating member facing the second heat transfer member, with the shielding sheet interposed therebetween.

The electronic device may further include a cooling member having at least one surface contacting the first heat radiating member and the second heat radiating member and formed to have an area corresponding to the shielding sheet. The cooling member may spread heat collected by the first heat radiating member and the second heat radiating member and then transfer the heat to an outside or an electronic device cover, thereby radiating heat.

The electronic device may further include at least one magnetic member disposed in an area where the shield can contacts the shielding sheet. The at least one magnetic member may include magnetic particles for shielding off low-frequency noise.

The shielding sheet is disposed along a first portion of the shield can surrounding the at least one opening and a second portion of the shield can facing the at least one opening.

According to an embodiment, an electronic device includes a housing, a circuit board disposed in the housing, at least one electric component disposed on one surface of the circuit board, a shield can formed to surround at least a portion of the at least one electric component and having an opening in a portion facing the at least one electric component, a shielding sheet disposed in at least a portion of the shield can and blocking at least a portion of the opening and a heat transfer member disposed in contact between the at least one electric component and the shielding sheet. The shielding sheet and the heat transfer member may have an integral structure. At least a portion of the shielding sheet may form a designated inclined surface or curved surface.

The shielding sheet may have a flexible structure. The shielding sheet may include a first area disposed in at least a portion of the shield can, a second area disposed on a top surface of the heat transfer member, and a third area extending from the first area to the second area and forming a designated inclined surface or curved surface.

The opening may be provided in a closed loop shape formed in a size corresponding to an area of the at least one electric component.

The shielding sheet and the heat transfer member are movable in a first direction towards the at least one electric component and in a second direction opposite to the first direction.

According to an embodiment, a method of manufacturing an electronic device includes pre-forming a shielding sheet including an inclined surface or a curved surface using a silicone compressing jig, aligning the pre-formed shielding sheet with a carrier film and attaching a heat radiating member to one surface of the pre-formed shielding sheet, integrating a heat transfer member to one surface of the pre-formed shielding sheet, attaching the integrated shielding sheet-heat transfer member structure to a shield can using the carrier film, removing the carrier film, and attaching a cooling sheet to one area of the carrier film-removed shielding sheet.

Each component (e.g., the module or the program) according to various embodiments may include at least one of the above components, and a portion of the above sub-components may be omitted, or additional other sub-components may be further included. Alternatively or additionally, some components may be integrated in one component and may perform the same or similar functions performed by each corresponding components prior to the integration. Operations performed by a module, a programming, or other components according to various embodiments of the present disclosure may be executed sequentially, in parallel, repeatedly, or in a heuristic method. Also, at least some operations may be executed in different sequences, omitted, or other operations may be added.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device, comprising:
a circuit board;
at least one electric component disposed on one surface of the circuit board;
a shield can mounted on the one surface of the circuit board, with the at least one electric component received in the shield can, and including at least one opening formed in an area corresponding to the at least one electric component;
a shielding sheet disposed in at least a portion of the shield can and blocking at least a portion of the at least one opening; and
a heat transfer member disposed in contact between the at least one electric component and the shielding sheet,
wherein the shielding sheet includes a flexible structure,
wherein the shielding sheet includes a first area disposed in at least a portion of the shield can, a second area disposed on a top surface of the heat transfer member, and a third area extending from the first area to the second area and forming a designated inclined surface or curved surface,
wherein the shielding sheet and the heat transfer member are movable in a first direction towards the at least one electric component and in a second direction opposite to the first direction,
wherein the at least one electric component includes a first electric component and a second electric component spaced apart from each other on the circuit board,
wherein the heat transfer member includes a first heat transfer member adhered onto the first electric component and a second heat transfer member adhered onto the second electric component,
wherein the electronic device further comprises a heat radiating member disposed to face the heat transfer member in the second area of the shielding sheet and collecting heat from the shielding sheet,
wherein the heat radiating member includes a first heat radiating member facing the first heat transfer member, with the shielding sheet interposed therebetween, and a second heat radiating member facing the second heat transfer member, with the shielding sheet interposed therebetween,
wherein the electronic device further comprises a cooling sheet including at least one surface contacting the first heat radiating member and the second heat radiating member and formed to have an area corresponding to the shielding sheet, and
wherein the cooling sheet is configured to spread heat collected by the first heat radiating member and the second heat radiating member and then transfer the heat to an outside or an electronic device cover.

2. The electronic device of claim 1, wherein the shielding sheet includes:
a shielding film including a nano fiber structure; and
a conductive adhesive film disposed on at least one surface of the shielding film,
wherein the conductive adhesive film adheres a bottom surface of the shielding film to the heat transfer member to form an integral structure of the shielding sheet and the heat transfer member.

3. The electronic device of claim 1, wherein at least a portion of the heat transfer member is disposed to pass through the at least one opening of the shield can, and wherein the heat transfer member is configured to directly transfer heat generated from the at least one electric component to the shielding sheet.

4. The electronic device of claim 1, wherein at least one of the shielding sheet and the heat transfer member includes an elastic material.

5. The electronic device of claim 1, wherein the heat radiating member includes a boron nitride (BN) based aluminum.

6. The electronic device of claim 5, further comprising a cooling sheet including at least one surface contacting the shielding sheet or the heat radiating member and formed to have an area corresponding to the shielding sheet, wherein the cooling sheet is at least one of a heat pipe or a vapor chamber.

7. The electronic device of claim 1, further comprising at least one magnetic member disposed in an area where the shield can contacts the shielding sheet, and
wherein the at least one magnetic member includes magnetic particles for shielding off low-frequency noise.

8. The electronic device of claim 1, wherein the heat transfer member is at least one of a carbon fiber thermal interface material (TIM) or an acrylic TIM.

9. The electronic device of claim 1, wherein the shielding sheet provides a three-dimensional (3D) shape structure that causes the at least one electric component disposed on the circuit board to be encapsulated in one sheet.

10. The electronic device of claim 1, wherein the shielding sheet is disposed along a first portion of the shield can surrounding the at least one opening and a second portion of the shield can facing the at least one opening.

11. An electronic device, comprising:
a housing;
a circuit board disposed in the housing;
at least one electric component disposed on one surface of the circuit board;
a shield can formed to surround at least a portion of the at least one electric component and including an opening in a portion facing the at least one electric component;
a shielding sheet disposed in at least a portion of the shield can and blocking at least a portion of the opening; and a heat transfer member disposed in contact between the at least one electric component and the shielding sheet, wherein the shielding sheet and the heat transfer member have an integral structure, wherein at least a portion of the shielding sheet forms a designated inclined surface or curved surface, wherein the shielding sheet has a flexible structure, wherein the shielding sheet includes a first area disposed in at least a portion of the shield can, a second area disposed on a top surface of the heat transfer member, and a third area extending from the first area to the second area and forming the designated inclined surface or curved surface, wherein the shielding sheet and the heat transfer member are movable in a first direction towards the at least one electric component and in a second direction opposite to the first direction, wherein the at least one electric component includes a first electric component and a second electric component spaced apart from each other on the circuit board, and wherein the heat transfer member includes a first heat transfer member adhered onto the first electric component and a second heat transfer member adhered onto the second electric component, wherein the electronic device further comprises a heat radiating member disposed to face the heat transfer member in the second area of the shielding sheet and collecting heat from the shielding sheet, wherein the heat radiating member includes a first heat radiating member facing the first heat transfer member, with the shielding sheet interposed therebetween, and a second heat radiating member facing the second heat transfer member, with the shielding sheet interposed therebetween, wherein the electronic device further comprises a cooling sheet including at least one surface contacting the first heat radiating member and the second heat radiating member and formed to have an area corresponding to the shielding sheet, and wherein the cooling sheet is configured to spread heat collected by the first heat radiating member and the second heat radiating member and then transfer the heat to an outside or an electronic device cover.

12. The electronic device of claim 11, wherein the opening is provided in a closed loop shape formed in a size corresponding to an area of the at least one electric component.

13. A method of manufacturing an electronic device, the method comprising:

pre-forming a shielding sheet including an inclined surface or a curved surface using a silicone compressing jig;

aligning the pre-formed shielding sheet with a carrier film and attaching a heat radiating member to one surface of the pre-formed shielding sheet;

integrating a heat transfer member to one surface of the pre-formed shielding sheet;

attaching the integrated shielding sheet-heat transfer member structure to a shield can using the carrier film;

removing the carrier film; and attaching a cooling sheet to one area of the carrier film-removed shielding sheet.

* * * * *